(12) United States Patent
Brick et al.

(10) Patent No.: US 11,415,814 B2
(45) Date of Patent: Aug. 16, 2022

(54) RADIATION-EMITTING DEVICE

(71) Applicant: OSRAM Opto Semiconductors GmbH, Regensburg (DE)

(72) Inventors: Peter Brick, Regensburg (DE); Hubert Halbritter, Dietfurt (DE); Mikko Perälä, Tampere (FI)

(73) Assignee: OSRAM OLED GmbH, Regensburg (DE)

( * ) Notice: Subject to any disclaimer, the term of this patent is extended or adjusted under 35 U.S.C. 154(b) by 350 days.

(21) Appl. No.: 16/366,558

(22) Filed: Mar. 27, 2019

(65) Prior Publication Data
US 2019/0302469 A1    Oct. 3, 2019

(30) Foreign Application Priority Data

Mar. 29, 2018   (DE) ..................... 10 2018 107 628.2

(51) Int. Cl.
  *G02B 30/27*    (2020.01)
  *H04N 13/305*   (2018.01)
(52) U.S. Cl.
  CPC ........... *G02B 30/27* (2020.01); *H04N 13/305* (2018.05)
(58) Field of Classification Search
  CPC ... H01L 25/0753; H01L 33/58; H01L 27/156; H01L 25/048; G09G 3/32; G09G 2300/0804; G09G 2300/0809; G09G 3/2003; G09G 2300/0452; G09G 2310/0297; G02F 1/13; G02F 1/133603; G02F 1/1335; G02F 1/133509; G02F 1/133512; G02F 1/133526; G09F 9/33; G02B 19/0066

USPC ............................................... 348/51, 46, 59
See application file for complete search history.

(56) References Cited

U.S. PATENT DOCUMENTS

| | | |
|---|---|---|
| 2006/0176245 A1 | 8/2006 | Sakai |
| 2012/0154713 A1* | 6/2012 | Kwon ............... G02F 1/133621 349/64 |
| 2015/0022440 A1* | 1/2015 | Liu ........................ G02B 30/27 345/156 |
| 2016/0050409 A1 | 2/2016 | Park |

(Continued)

FOREIGN PATENT DOCUMENTS

| | | | |
|---|---|---|---|
| DE | 10 2017 117 540 A1 | 2/2019 | |
| JP | 2010080423 A * | 4/2010 | ......... H01L 27/3213 |

OTHER PUBLICATIONS

Examination Report dated May 16, 2022, of counterpart German Patent Application No. 10 2018 107 628.2, along with an English translation.

*Primary Examiner* — Jade R Chwasz
(74) *Attorney, Agent, or Firm* — DLA Piper LLP (US)

(57) ABSTRACT

A radiation-emitting device including a radiation source, an emission surface through which radiation from the radiation source passes during operation, wherein the emission surface includes a plurality of pixels, each pixel includes a plurality of subpixels, in plan view of the emission surface, each pixel forms a partial area of the emission surface and each subpixel forms a portion of such partial area, for each pixel, at least first subpixels are operable individually and independently of one another, and all subpixels of a pixel together make up at most 50% of the area of the pixel so that in simultaneous operation of all subpixels radiation is emitted via at most 50% of the area of the pixel.

17 Claims, 6 Drawing Sheets

(56) References Cited

U.S. PATENT DOCUMENTS

2016/0195731 A1\* 7/2016 Murao .................. H04N 13/31
                                                349/15
2017/0163975 A1   6/2017 Jin
2017/0236866 A1\* 8/2017 Lee ....................... H01L 33/505
                                                257/89

\* cited by examiner

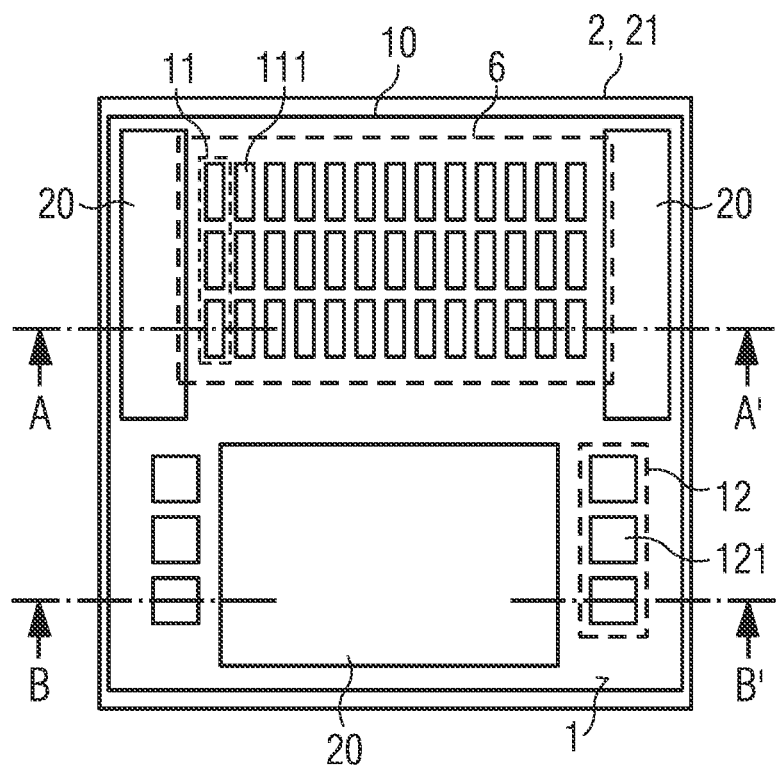
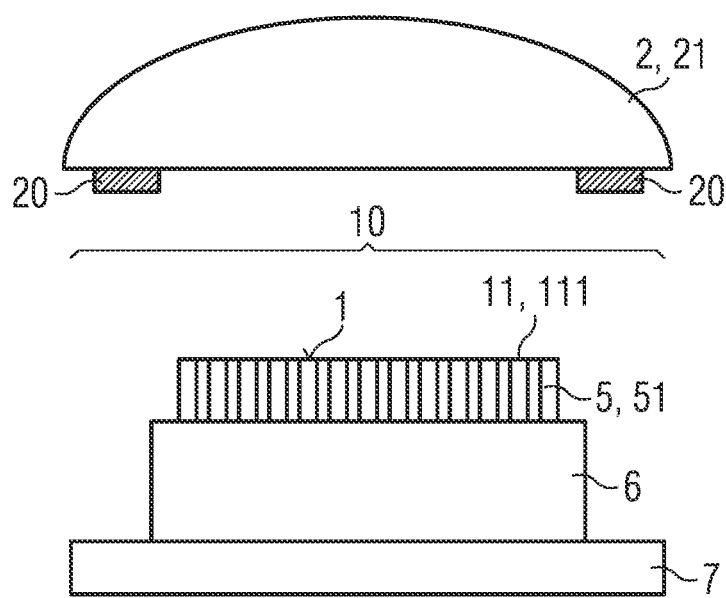

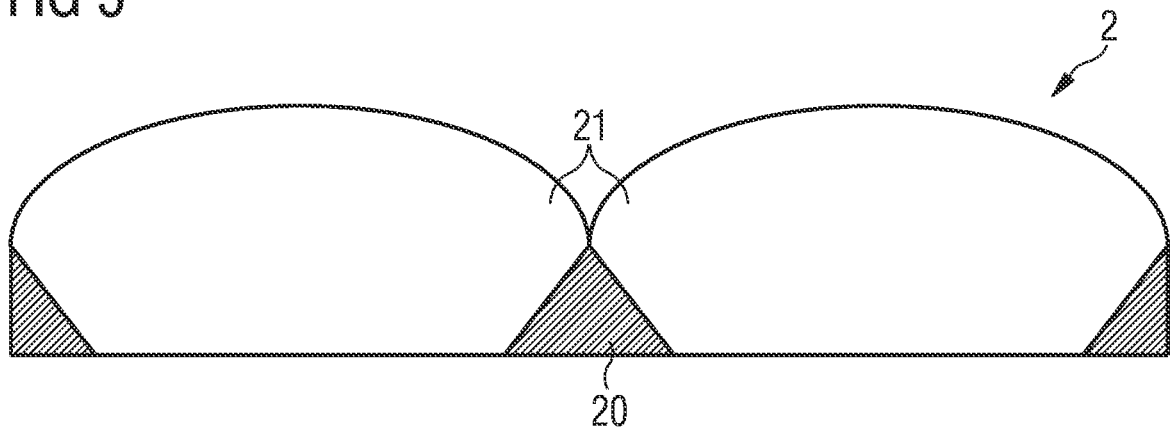

RADIATION-EMITTING DEVICE

TECHNICAL FIELD

This disclosure relates to a radiation-emitting device.

BACKGROUND

It could be helpful to provide a radiation-emitting device with an improved contrast ratio.

SUMMARY

We provide a radiation-emitting device including a radiation source, an emission surface through which radiation from the radiation source passes during operation, wherein the emission surface includes a plurality of pixels, each pixel includes a plurality of subpixels, in plan view of the emission surface, each pixel forms a partial area of the emission surface and each subpixel forms a portion of such partial area, for each pixel, at least first subpixels are operable individually and independently of one another, all subpixels of a pixel together make up at most 50% of the area of the pixel so that in simultaneous operation of all subpixels radiation is emitted via at most 50% of the area of the pixel.

We also provide a radiation-emitting device including a radiation source, an emission surface through which radiation from the radiation source passes during operation, an optical element arranged downstream of the emission surface in a radiation direction and configured to deflect the radiation emitted from the emission surface, wherein the emission surface includes a plurality of pixels, each pixel includes a plurality of subpixels, in plan view of the emission surface, each pixel forms a partial area of the emission surface and each subpixel forms a portion of such partial area, for each pixel, at least first subpixels are operable individually and independently of one another, at least some of the pixels include one or more second subpixels operable independently of the first subpixels, all subpixels of a pixel together make up at most 50% of the area of the pixel, so that in simultaneous operation of all subpixels radiation is emitted via at most 50% of the area of the pixel, the optical element directs radiation from the first subpixels of some pixels exclusively into a first spatial region, the optical element directs radiation from the second subpixels of some pixels exclusively into a second spatial region, the first and the second spatial regions do not overlap with each other at distances from the emission surface larger or equal than a minimum distance, the radiation-emitting device is configured such that, in operation, it produces an image with a three-dimensional optical impression for an observer in the first spatial region who looks at the emission surface, and the radiation-emitting device is configured such that it produces an image with a two-dimensional optical impression for an observer in the second spatial region who looks at the emission surface.

BRIEF DESCRIPTION OF THE DRAWINGS

FIGS. 2A, 2B, 3A, and 3B are sections of examples of the radiation-emitting device in plan view of the emission surface.

FIGS. 2C, 2B, 3C, and 3D are sections of examples of the radiation-emitting device in cross-sectional view.

FIG. 5 is an example of the optical element in cross-sectional view.

Figure 1:
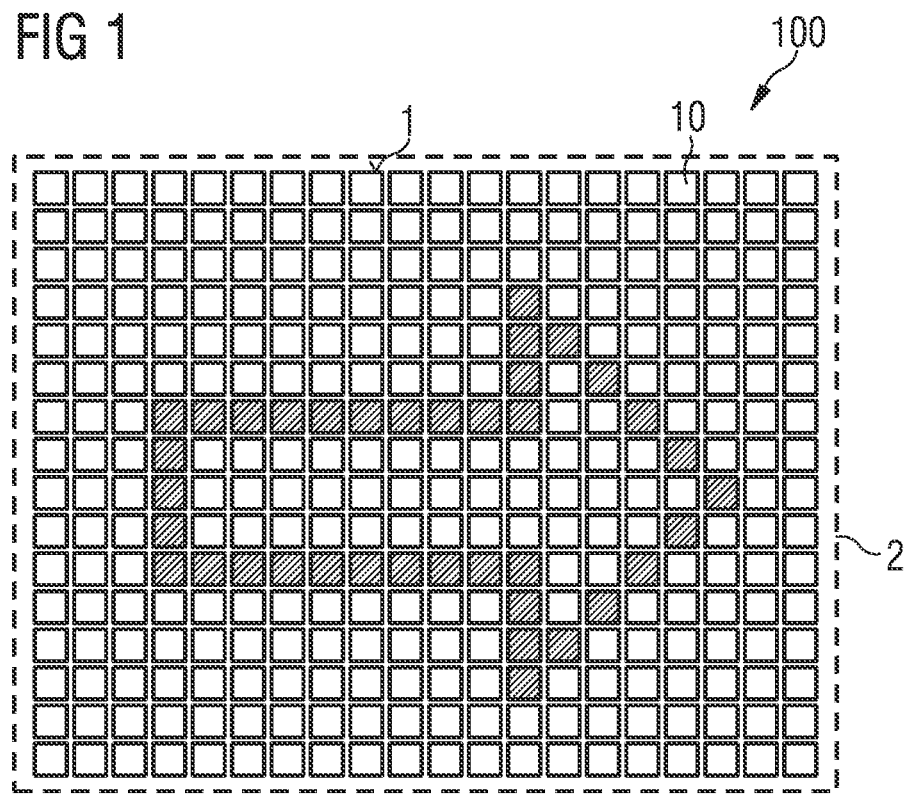
FIG. 1 is an example of a radiation-emitting device in plan view of the emission surface.

REFERENCE SIGN LIST 1 emission surface
2 optical element
3 first spatial region
4 second spatial region
5 radiation source
6 integrated circuit
7 carrier
10 pixel
10a first rectangular portion
10b further rectangular portion
11 first subpixel
12 second subpixel
20 masking
21 lens
51 first semiconductor chip
52 second semiconductor chip
100 radiation-emitting device
111 sub-subpixel
121 sub-subpixel

DETAILED DESCRIPTION

Our radiation-emitting device comprises a radiation source and an emission surface. During operation of the device, radiation from the radiation source passes through the emission surface. The radiation emitted by the radiation source is preferably light in the visible spectral range. The radiation source may comprise one or more optoelectronic semiconductor chips or light-emitting diodes or one or more organic light-emitting diodes. The emission surface can be partially formed by the radiation source. However, the emission surface can also be formed by a separate element, such as a liquid crystal element.

The emission surface may comprise a plurality of pixels. A pixel is understood to be an image point or an image cell or an image element. A pixel is an emission field of the emission surface. In the region of an operated pixel, radiation from the radiation source passes through the emission surface. This radiation can then leave the device or be coupled into other components of the device.

The pixels are preferably individually and independently controllable. All pixels of the radiation-emitting device together can be used, for example, to display an image. The device is therefore preferably a display element, for example, a display such as an LC display or an OLED display.

The pixels are preferably arranged side by side in a lateral direction, i.e. in a direction parallel to a main extension plane of the device or of the emission surface. A principal extension plane of the device or emission surface is a compensation plane through the device or emission surface.

For example, the emission surface comprises at least 100 or at least 1000 or at least 1000000 pixels. The pixels can be arranged matrix-like. For example, each pixel is arranged at a grid point of a grid, for example, a rectangular grid or a square grid or a hexagonal grid or a parallelogram grid.

Each pixel may comprise a plurality of subpixels. A subpixel is a subunit of a pixel. For example, each pixel comprises at least two or at least five or at least ten or at least 50 or at least 100 subpixels. The pixels preferably each comprise the same number of subpixels.

Each pixel may form a partial area of the emission surface when viewed in plan view of the emission surface, in particular a simply-connected partial area. This partial area may have a square or rectangular or parallelogram or hexagonal or triangular or circular or ellipsoidal shape. Each subpixel forms a portion, in particular a simply-connected portion, of such a partial area. The subpixels are preferentially assigned to the pixels unambiguously. This means that the portion formed by a subpixel lies only in a single partial area formed by a pixel.

In other words, all subpixels of a pixel can be included with a contour of a partial area such as a square or rectangle or parallelogram or hexagon or triangle or circle or ellipse, wherein the contour forms the edge of the pixel or the partial area formed by the pixel. The contour preferably includes only portions of the subpixels assigned to the pixel.

The portions formed by different subpixels do not overlap. The portions formed by the subpixels may also have a rectangular or square or parallelogram or hexagonal or triangular or circular or elliptical shape.

For example, a pixel has an area of at least 0.01 mm$^2$ or at least 0.1 mm$^2$ or at least 0.5 mm$^2$. Alternatively or additionally, the area of a pixel may be at most 100 mm$^2$ or at most 10 mm$^2$ or at most 5 mm$^2$.

For example, the size of a subpixel is at least 1 μm$^2$ or at least 10 μm$^2$ or at least 50 μm$^2$. Alternatively or additionally, the size of a subpixel may be at most 1000 μm$^2$ or at most 500 μm$^2$ or at most 200 μm$^2$.

A lateral distance between two adjacent pixels, for example, is a maximum of 50 μm, in particular a maximum of 5 μm. In particular, adjacent pixels are arranged directly adjacent to each other.

At least first subpixels of each pixel can be operated individually and independently of one another. This means that each pixel preferably comprises several first subpixels that can be operated independently of one another. For example, each pixel comprises at least two or at least five or at least ten or at least 50 or at least 100 first subpixels. The first subpixels are a subset of the subpixels.

When operating a subpixel, radiation is emitted over the corresponding portion of the emission surface. A subpixel can be switched on and off via electrical control. In the switched-off state, no radiation or at most 5% of the radiation intensity of the switched-on state is emitted over the portion of the emission surface assigned to the switched-off subpixel. Each first subpixel can be switched on and off independently of the other first subpixels of the pixel.

An operated subpixel may emit radiation over its entire area. This means that the portion of the emission surface assigned to a subpixel is defined by the area through which radiation from the radiation source emerges from the emission surface when the subpixel is switched on. In particular, all regions of the emission surface over which radiation is emitted during operation are assigned to subpixels. Regions of the emission surface that do not form part of a subpixel are not configured to emit radiation.

All subpixels of a pixel may make up at most 50% or at most 40% or at most 30% or at most 20% or at most 10% of the area of the pixel. Consequently, in the simultaneous operation of all subpixels of a pixel radiation is emitted via at most 50% or at most 40% or at most 30% or at most 20% or at most 10% of the area of that pixel. This applies preferably to several, especially to all pixels of the emission surface. For example, all subpixels of a pixel together make up at least 5% of the area of the pixel.

In other words, at most, the above-mentioned area fraction of the area of a pixel is configured to emit radiation. This means that at least 50% or at least 60% or at least 70% or at least 80% or at least 90% of the pixel area is not configured to emit radiation. No radiation is emitted over this region during normal operation.

The radiation-emitting device may comprise a radiation source and an emission surface through which radiation from the radiation source passes during operation. The emission surface comprises a plurality of pixels. Each pixel comprises a plurality of subpixels. In plan view of the emission surface, each pixel forms a partial area of the emission surface and each subpixel forms a portion of such a partial area. For each pixel, at least the first subpixels can be operated individually and independently of one another. An operating subpixel emits radiation over its entire area. All subpixels of a pixel make up at most 50% of the area of the pixel, so that in simultaneous operation of all subpixels radiation is emitted via at most 50% of the area of the pixel.

Our devices are based, inter alia, on the reorganization that pixelated emission surfaces, for example, for autostereoscopic displays, often exhibit poor contrast ratios, especially poor black levels. By a fill factor of the pixels of at most 50%, i.e. by an allocation of the pixel area to at most 50% with subpixels, the areas of the pixel, which are not assigned to subpixels, can be used for the improvement of the contrast ratio or black value.

The radiation-emitting device may further comprise an optical element arranged downstream of the emission surface in a radiation direction and configured to deflect the radiation emitted from the emission surface. The optical element may, for example, comprise one or more lenses or one or more prisms. For example, the optical element is located at a distance of at most 1 cm or at most 1 mm or at most 100 μm from the emission surface. In plan view of the emission surface, the optical element can completely or at least by 80% cover the emission surface.

The optical element in operation directs radiation from the first subpixels of some or all pixels exclusively or to at least by 80% into a first spatial region. The first spatial region is preferably a simply-connected spatial region. For example, the first spatial region covers a solid angle range of at least 0.25·π with respect to a center of the emission surface. For example, a normal on the emission surface and through a center of the emission surface runs through the first spatial region. The first spatial region can be arranged symmetrically around this normal.

The radiation-emitting device may be configured such that, during operation, it produces an image with a three-dimensional optical impression for an observer in the first spatial region who looks at the emission surface. This means that the first subpixels of the pixels are configured to generate a three-dimensional image during operation.

For the perception of the three-dimensional image impression in the first spatial region an aid may be necessary, for example, polarization glasses or shutter glasses. Preferably, however, no such aid is necessary. The radiation-emitting device generates a three-dimensional image impression, for example via autostereoscopy.

The radiation-emitting device may be configured such that during operation it displays different perspectives of an image in different zones of the first spatial region. The zones preferably do not overlap with each other at distances from the emission surface larger or equal than a minimum distance. The minimum distance may be at least 50 cm or at least 1 m or at least 5 m. The simultaneous perception of two perspectives creates a three-dimensional image impression for the observer. For example, the radiation-emitting device emits an image in each of n zones. n is a number≥2 or ≥10 or ≥50. In particular, the number of first subpixels of each pixel corresponds to the number of zones. For a viewer who perceives an m-th zone with one eye and an m+1th zone with the other eye (1≤m≤n−1), this results in a three-dimensional image impression. For example, a different perspective of the image is displayed in each of the zones.

At least some, preferably all, pixels comprise one or more second subpixels. The second subpixels can be operated independently of the first subpixels of the pixel. For example, the second subpixels of a pixel can be operated individually and independently of each other. Alternatively, the second subpixels of a pixel can only be operated together. The second subpixels are a subset of the subpixels of a pixel. For example, the first subpixels and the second subpixels of a pixel form the total number of all subpixels of the pixel.

The second subpixels are preferably larger than the first subpixels, for example, at least 1.5 times as large or at least twice as large. For example, a distance between every first and second subpixel of a pixel is at least 10 μm or at least 50 μm.

During operation, the optical element may direct radiation from the second subpixels of some or all pixels exclusively or at least by 80% into a second spatial region.

The first spatial region and the second spatial region need not overlap with each other at distances from the emission surface larger or equal than a minimum distance, i.e. are disjunct there. For example, the minimum distance is at least 50 cm or at least 1 m or at least 5 m. For example, the second spatial region covers a solid angle range of at least $0.25 \cdot \pi$ with respect to the center of the emission surface.

The radiation-emitting device may be configured such that, in operation, it produces an image with a two-dimensional optical impression for an observer in the second spatial region who looks at the emission surface. This means that the second subpixels of all pixels together create a two-dimensional image. At any location in the second spatial region, the observer always perceives only a two-dimensional image.

One or more pixels or all pixels may each form a parallelogram-shaped partial area of the emission surface when viewed in plan view. This means that all subpixels of a pixel can be included with the contour of a parallelogram, wherein the contour only includes the subpixels assigned to the pixel.

The parallelogram-shaped partial area formed by a pixel can be divided into at least two or exactly two disjoint, parallelogram-shaped portions, preferably of equal size, disjoint, parallelogram-shaped portions so that all first subpixels of the pixel are arranged in a first parallelogram-shaped portion and all second subpixels of the pixel are arranged in one or more further parallelogram-shaped portions. Each parallelogram-shaped portion comprises an edge that is as long as an edge of the parallelogram-shaped partial area formed by the pixel. In this way, the first subpixels and the second subpixels are particularly advantageously separated from each other so that an optical separation is simplified when imaging the subpixels into different spatial regions and crosstalk is avoided.

Preferably, the first subpixels and the second subpixels are arranged such that if the first parallelogram-shaped portion and the further parallelogram-shaped portion(s) are superimposed with maximum overlap, the first subpixels and the second subpixels do not overlap.

The parallelograms are preferably rectangles.

Alternatively or additionally, within a pixel every second subpixel may be spaced from every first subpixel by a minimum distance of at least $\frac{1}{10}$ of the shortest edge length of the parallelogram-shaped partial area formed by the pixel. This applies preferably in several or all pixels.

An area coverage density with first subpixels in the first parallelogram-shaped portion is larger, for example, at least twice as large, as an area coverage density with second subpixels in the other parallelogram-shaped portions(s). For example, all first subpixels in the first parallelogram-shaped portion account for at least 20% or at least 30% of the area of the first parallelogram-shaped portion. For example, all second subpixels account for at most 20% or at most 10% of the area of the other parallelogram-shaped portion(s).

The regions of a pixel, in particular of all pixels, that do not emit any radiation during operation may be configured to absorb radiation at least in certain areas. In other words, the regions of the emission surface formed by a pixel not assigned to a subpixel are at least partially radiation absorbing. In particular, these regions absorb the radiation generated by the radiation source and/or light in the visible spectral range. For this radiation, for example, a degree of absorption is at least 50% or at least 75% or at least 90%. The degree of absorption is given for the wavelength at which the radiation has a global maximum intensity. For example, the degree of absorption for a wavelength of 500 nm to 600 nm is one of the minimum values mentioned above. For example, the regions not formed by subpixels are colored black. In particular, at least 30% of the partial area formed by a pixel is configured to absorb radiation.

Such a design further improves the black level of the radiation-emitting device.

The optical element may have a radiation-absorbing masking on a side facing the emission surface. For the masking, the absorption properties referred to in the previous paragraph may apply. For example, a maximum of 5% of the radiation coming from the emission surface passes through the masking. The masking can be a coating, in particular a black coating, on the side of the optical element facing the emission surface.

In plan view of the emission surface, the masking may at least partially cover the regions of a pixel or of some pixels or of all pixels that do not emit radiation during operation. In other words, the masking at least partially covers the regions of the emission surface that are not assigned to subpixels. "At least partially" means, for example, at least 50% or at least 75% or at least 90%.

The regions of the optical element that do not overlap with the masking when viewed in plan view of the emission surface are, for example, transparent or translucent.

The optical element may comprise a plurality of lenses such as cylindrical lenses.

A pixel or some pixels or all pixels may each be assigned a least one lens, for example, uniquely assigned, wherein the lens is configured to deflect the radiation emerging from the pixel. When viewed in plan view of the emission surface, a lens assigned to a pixel overlaps, for example, with the first and/or second subpixels of the pixel.

A pixel may be assigned several lenses, for example, uniquely assigned. This means that a pixel may be assigned at least two lenses. Preferably, some or all pixels are each assigned at least two lenses. At least one of the lenses assigned to a pixel can also be assigned to an adjacent pixel at the same time and overlap with the adjacent pixel in plan view.

In plan view of the emission surface, a lens assigned to a pixel may overlap only with the first, in particular all first, subpixels of the pixel and, in plan view, one or more further lenses assigned to the pixel overlap only with the second subpixels of the pixel. In other words, the first subpixels are assigned their own lens, configured to deflect the radiation coming from the first subpixels. The second subpixels are assigned one or more further lenses configured to deflect the radiation emitted from the second subpixels. The lenses may be cylindrical lenses.

In this example it is particularly advantageous that the properties of the lenses can be adapted to the images to be generated with the different subpixels. This means that different lenses can be used to display the 3D image and the 2D image.

According to at least one example, the radiation source comprises a plurality of optoelectronic semiconductor chips.

Some pixels may be assigned different optoelectronic semiconductor chips. The fact that a pixel or a subpixel is assigned an optoelectronic semiconductor chip means that radiation from this optoelectronic semiconductor chip passes through the emission surface in the partial area defined by this pixel or in the portion defined by this subpixel. In plan view of the emission surface, the partial area of the emission surface formed by the pixel or the portion of the pixel formed by the subpixel then preferentially partially or completely covers the assigned optoelectronic semiconductor chip.

For example, each pixel is assigned one or more optoelectronic semiconductor chips.

However, several pixels, for example, several pixels of a row or a column, can also be formed by a single semiconductor chip. In this example, these several pixels are each formed by a portion or region of the semiconductor chip, for example.

It is also possible that several first or second subpixels of different pixels and/or within a pixel are assigned to the same optoelectronic semiconductor chip.

The different subpixels of a pixel can be assigned different portions or regions of an optoelectronic semiconductor chip. For example, the optoelectronic semiconductor chip has a segmented active layer for this purpose.

Alternatively, it is also possible that different subpixels of a pixel are assigned different optoelectronic semiconductor chips.

An optoelectronic semiconductor chip is created by separation from a wafer composite. In particular, side surfaces of an optoelectronic semiconductor chip show traces from the separation process of the wafer composite. A semiconductor chip preferably comprises exactly one originally contiguous region of the semiconductor layer sequence grown in the wafer composite. The semiconductor layer sequence of the semiconductor chip is preferably formed contiguously. For example, the lateral expansion of the semiconductor chip measured parallel to the main extension direction of the active layer is at most 1% or at most 5% or at most 10% greater than the lateral expansion of the active layer or of the semiconductor layer sequence. The semiconductor chip, for example, also comprises the growth substrate on which the entire semiconductor layer sequence has grown.

The optoelectronic semiconductor chips can be so-called volume emitters, especially flip-chips. In this example, the semiconductor chips preferably comprise the growth substrate, which is formed from sapphire, for example. Alternatively, the semiconductor chips can also be surface emitters, especially so-called thin-film chips. For example, the growth substrate is detached.

The first subpixels and the second subpixels of a pixel may be assigned different optoelectronic semiconductor chips. For example, the first subpixels of a pixel are all assigned the same optoelectronic semiconductor chip, wherein the first subpixels are assigned different segments of this optoelectronic semiconductor chip. The second subpixels of the pixel may be assigned a further optoelectronic semiconductor chip or several further optoelectronic semiconductor chips. For example, every second subpixel of a pixel can be formed by its own optoelectronic semiconductor chip.

The realization of the first subpixels and the second subpixels of a pixel by different semiconductor chips can, for example, have the advantage that the different semiconductor chips can be energized to different intensities. This allows, for example, the luminance of the first subpixel and the second subpixel to be matched to each other so that the image brightness remains constant at the transition from the first spatial region to the second spatial region.

Alternatively to the realization of the different pixels and subpixels by optoelectronic semiconductor chips, it is also possible to realize the pixels and subpixels by a liquid crystal element (LC element) or an OLED layer sequence. For example, the individual pixels and individual subpixels are then assigned different regions of the liquid crystal element or of the OLED layer sequence.

A pixel may be uniquely assigned a first integrated circuit, the first integrated circuit being configured to individually and independently electrically drive the first subpixels of the associated pixel. Preferably, several or all pixels may each be uniquely assigned an integrated circuit in the same way. The integrated circuit can be an application-specific integrated circuit (ASIC).

The second subpixels of the pixel may be controlled in operation by an electronic component other than the first integrated circuit. The second subpixels of a pixel can be controlled via wire contacts. However, it is also possible that the second subpixels are controlled by another integrated circuit of the pixel. One advantage of using different electronic components is that the first subpixels and the second subpixels can, for example, be energized with different current intensities, which in turn allows different luminances of the first subpixels and the second subpixels to be achieved.

As an alternative to controlling the first subpixels and the second subpixels of a pixel via different electronic components, it is also possible to control the first subpixels and the second subpixels via the same integrated circuit.

Some subpixels, preferably all subpixels, may be configured to emit light in the blue and/or green and/or red spectral range. In particular, each subpixel is an RGB unit. Each subpixel can be subdivided into at least three sub-subpixels, each of which emits light in different colors during operation. The brightness and color coordinates of the radiation emitted by a subpixel can thus be adjusted by separately controlling different sub-subpixels.

The realization of different colors of a sub-subpixel can be achieved by conversion elements or different compositions of semiconductor layer sequences.

It is possible that sub-subpixels of the same type, i.e. sub-subpixels emitting the same color, from subpixels of different pixels and/or within a pixel are assigned to the same optoelectronic semiconductor chip. For example, all red sub-subpixels of the first subpixels or of the second subpixels of a pixel row or of a pixel are assigned to the same semiconductor chip. The same can apply to green and/or blue sub-subpixels.

The radiation-emitting device may be an autostereoscopic display. The display can be used, for example, as a smartphone display or TV display or cinema screen.

In the following, radiation-emitting devices described herein are explained in more detail with reference to drawings on the basis of examples. Same reference signs indicate the same elements in the individual figures. However, the size ratios involved are not to scale, individual elements may rather be illustrated with an exaggerated size for a better understanding.

FIG. 1 shows an example of the radiation-emitting device 100 in plan view of an emission surface 1 of the device 100. The emission surface 1 comprises a plurality of pixels 10 that can be individually and independently controlled. An image can be displayed by selectively controlling the pixels 10. In this example, the pixels 10 are controlled such that the radiation-emitting device 100 images an arrow.

The emission surface 1 is covered by an optical element 2 (shown as a dashed rectangle). The optical element 2 serves to deflect the radiation emitted by the emission surface 1.

Figure 2A:
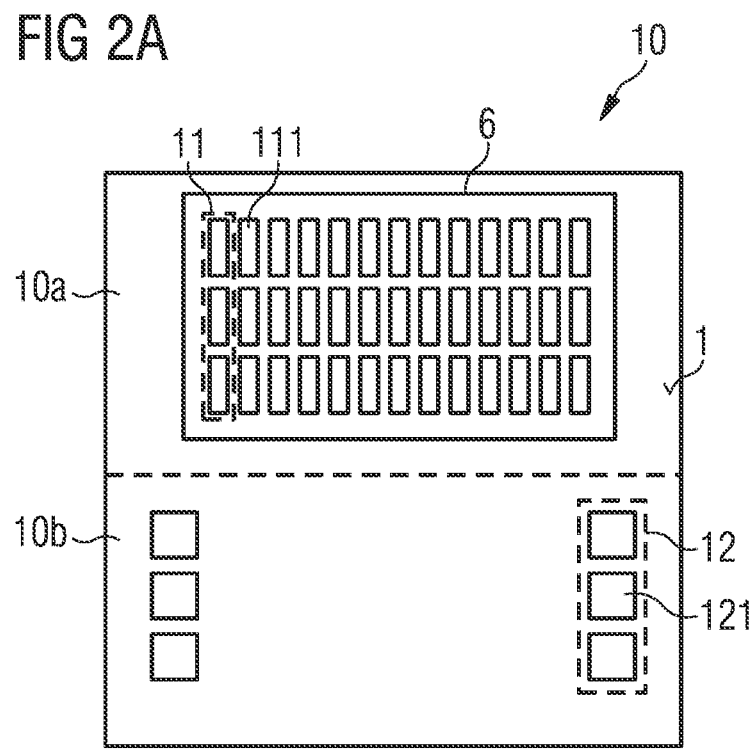

FIG. 2A shows a section of an example of the radiation-emitting device 100 in plan view of the emission surface 1. The section shows a single pixel 10. The pixel 10 includes first subpixels 11 and second subpixels 12 (indicated by dashed boxes). The subpixels 11, 12 in turn each comprise three sub-subpixels 111, 121, through which red, green and blue radiation can be emitted. Depending on which of the sub-subpixels 111, 112 are controlled, the color of the radiation emitted by the subpixels 11, 12 can be adjusted.

The first subpixels 11 can be controlled independently of each other and independently of the second subpixels 12. For this purpose, the first subpixels 11 is assigned a common integrated circuit 6 that controls the first subpixels 11. The second subpixels 12 are not driven by this integrated circuit 6, but by another electronic component (not shown). A controlled subpixel 11, 12 emits radiation over its entire area. The pixel 10 is configured such that the area of all subpixels 11, 12 occupies at most 50% of the area of the entire pixel 10.

The pixel 10 of FIG. 2A can be divided into exactly two rectangular portions 10a, 10b, wherein the first subpixels 11 are all arranged in the first portion 10a and the second subpixels 12 are all arranged in the second portion 10b. The local separation of the first subpixels 11 from the second subpixels 12 facilitates an independent optical imaging of these subpixels 11, 12 into different spatial regions.

FIG. 2B shows the same section as FIG. 2A, except that the pixel 10 is now additionally covered by an optical element 2. The optical element 2 comprises a multitude of lenses 21. Each pixel 10 is uniquely assigned a lens 21. The pixel 10 shown in FIG. 2B is covered by exactly one lens 21. The lens 21, for example, is a cylindrical lens.

It can also be seen that the lens 21 has a masking 20, which is located, for example, on the side of the lens 21 facing the emission surface 1. The masking 20 covers regions of the emission surface 1 or of the pixels 10 that are not formed by the first 11 or second 12 subpixels. The masking 20 is particularly configured to absorb radiation and is used to improve the black level or contrast of the pixel 10 and optically separate the first subpixels 11 and the second subpixels 12.

FIG. 2C shows the section of FIG. 2B in cross-sectional view. This is the cross-sectional view when cutting through the cut line AA' shown in FIG. 2B. In this view, it can be seen that the radiation-emitting device 100 also comprises a radiation source 5. During operation, radiation from the radiation source 5 passes through the emission surface 1 and the optical element 2 that leads to the representation of an image. In this example, the radiation source 5 comprises first optoelectronic semiconductor chips 51, wherein each pixel 10 is uniquely assigned a first optoelectronic semiconductor chip 51.

The pixel 10 shown in FIG. 2C is partly formed by a surface of the first optoelectronic semiconductor chip 51, of the integrated circuit 6 and of a carrier 7. The first optoelectronic semiconductor chip 51, for example, is a segmented semiconductor chip. The individual segments of the first optoelectronic semiconductor chip 51 can be individually and independently controlled by means of the integrated circuit 6. The individual segments form the sub-subpixels 111 and the first subpixels 11.

FIG. 2C also shows that a cylindrical lens 21 is arranged downstream of the pixel 10 in a radiation direction and uniquely assigned to the pixel 10. The cylindrical lens 21 comprises a masking 20 on the side facing the first optoelectronic semiconductor chip 51. The cylindrical lens 21 serves in particular to direct the radiation emitted by the individual first subpixels 11 into different zones of a first spatial region so that the radiation-emitting device 100 forms an autostereoscopic display.

Figure 2D:
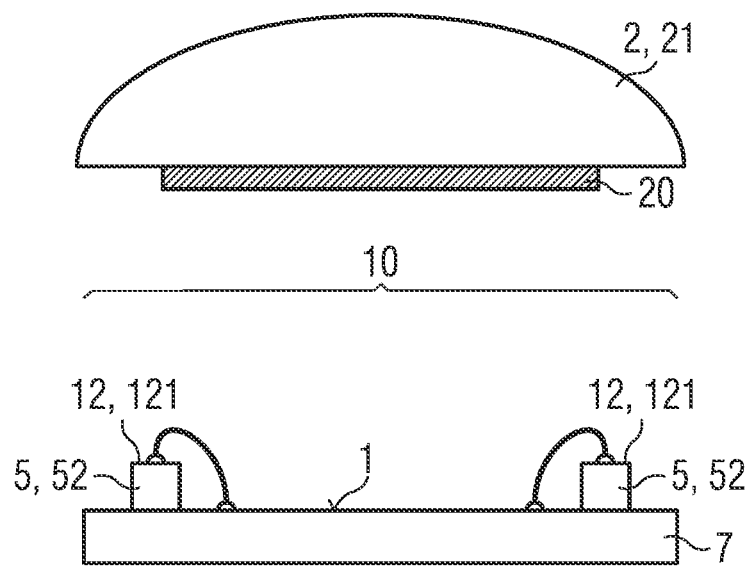

FIG. 2D shows a cross-sectional view of FIG. 2B when cutting along the line BB'. The second subpixels 12 are uniquely assigned second optoelectronic semiconductor chips 52. The second optoelectronic semiconductor chips 52 are in turn part of the radiation source 5. The second optoelectronic semiconductor chips 52 can each be segmented again, with each segment of the second optoelectronic semiconductor chips 52 then forming a sub-subpixel 121 of the second subpixel 12. Alternatively, it is also possible that each sub-subpixel 121 of the second subpixel 12 is formed by its own second optoelectronic semiconductor chip 52.

The second optoelectronic semiconductor chips 52 are arranged on the same carrier 7 as the first optoelectronic semiconductor chips 51. The second optoelectronic semiconductor chips 52 are electrically contacted by an electronic component other than the integrated circuit 6. The second optoelectronic semiconductor chips 52 connect to the carrier 7 via contact wires. Since the first subpixels 11 and the second subpixels 12 are realized by different optoelectronic semiconductor chips 51, 52 and electrically contacted via different electronic components, the luminance levels achieved by the first subpixels 11 and the second subpixels 12 can be individually adjusted.

The radiation emitted by the second subpixels 12 is directed into a second spatial region by the cylindrical lens 21. The second spatial region surrounds the first spatial region into which the radiation from the first subpixels 11 is directed. This is achieved in particular by the fact that the second semiconductor chips 52 are arranged further out on the carrier 7 than the first semiconductor chips 51.

Figure 3A:
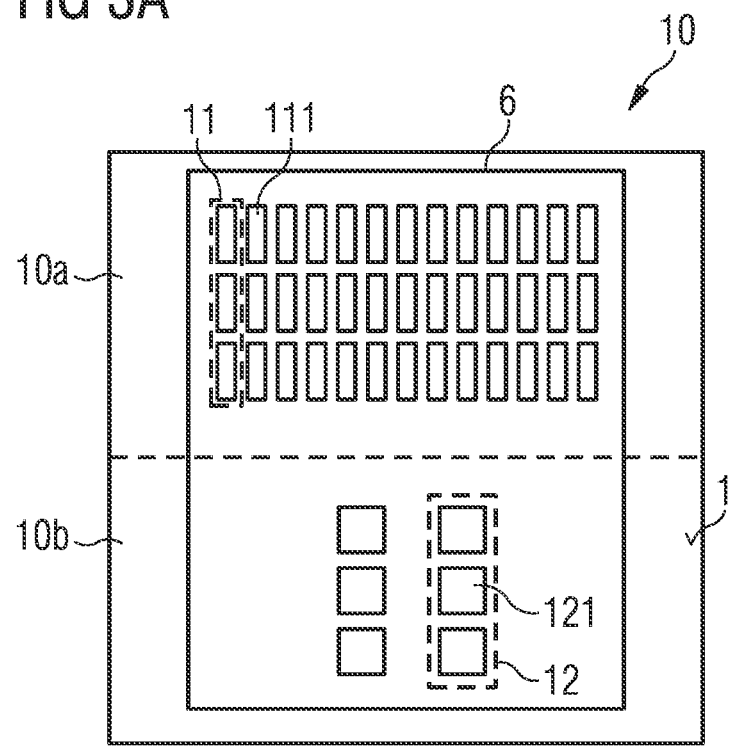

FIG. 3A shows a section of a second example of the radiation-emitting device 100. The section is again the plan view of a single pixel 10. In contrast to FIG. 2A, the first subpixels 11 and the second subpixels 12 are arranged on a common integrated circuit 6. This means that the electrical contacting of the first subpixels 11 and the second subpixels 12 takes place via the same electronic component. In addition, the second subpixels 12 are arranged closer to each other and shifted towards the center of the pixel area.

Figure 3B:
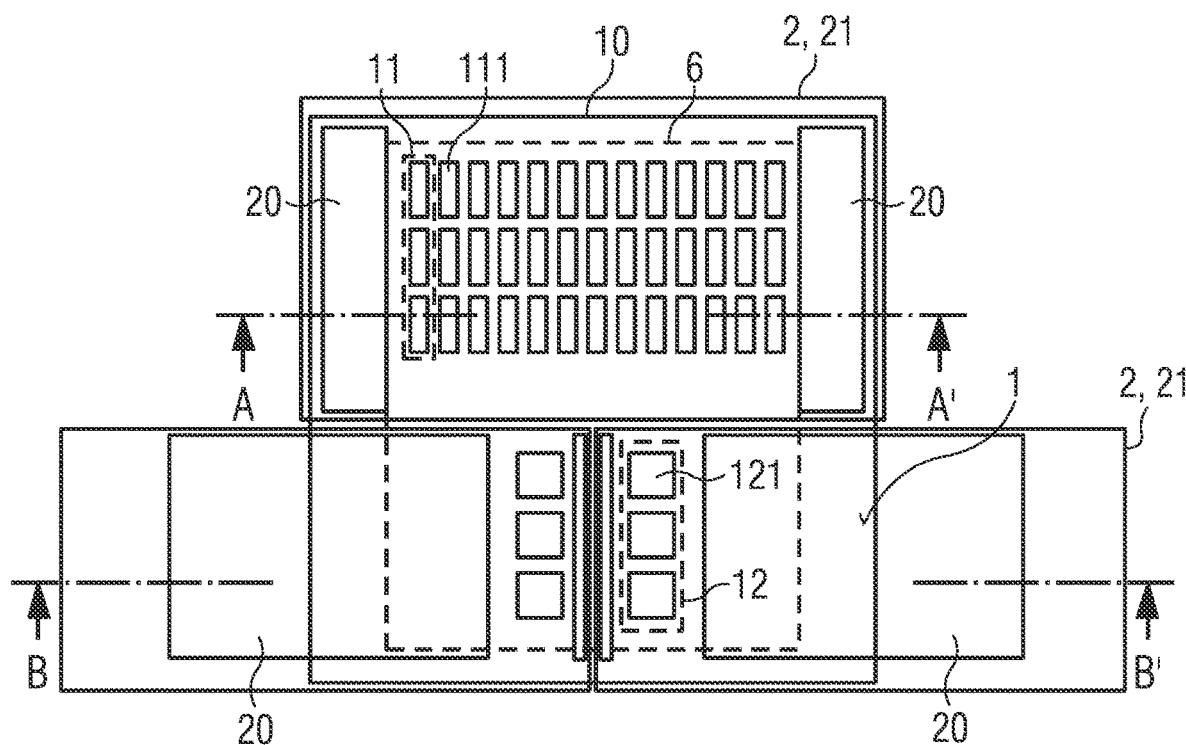

Compared to FIG. 3A, FIG. 3B additionally shows the optical element 2 that covers the emission surface 1. Three lenses 21 are assigned to a pixel 10. A first lens 21 exclusively covers the first subpixels 11 of the pixel 10, a second and a third lens 21 exclusively cover the second subpixels 21. The second and third lens 21 also cover second subpixels 12 of adjacent pixels (not shown). By using different lenses 21 to image the radiation from the different subpixels 11, 12, a further degree of freedom is achieved to image the radiation emitted by the subpixels 11, 12. The lenses 21 again have a masking 20 on their side facing the emission surface 1 in order to increase the contrast ratio or the black value.

Figure 3C:
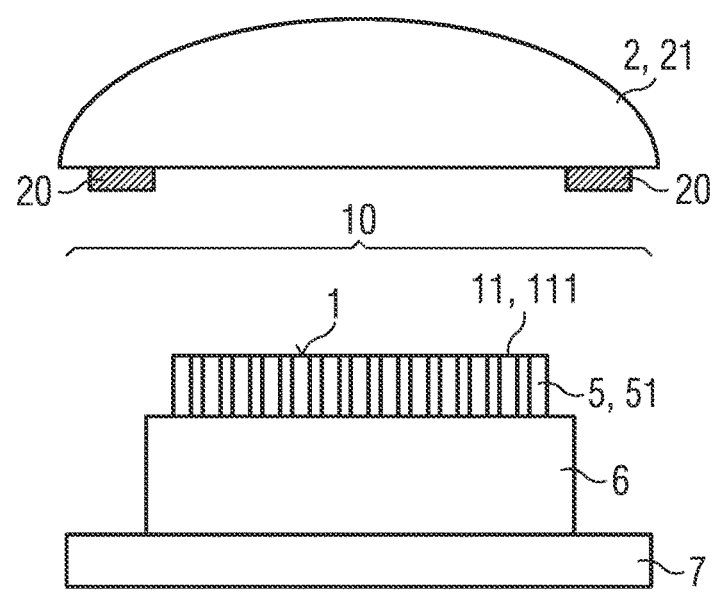
Figure 3D:
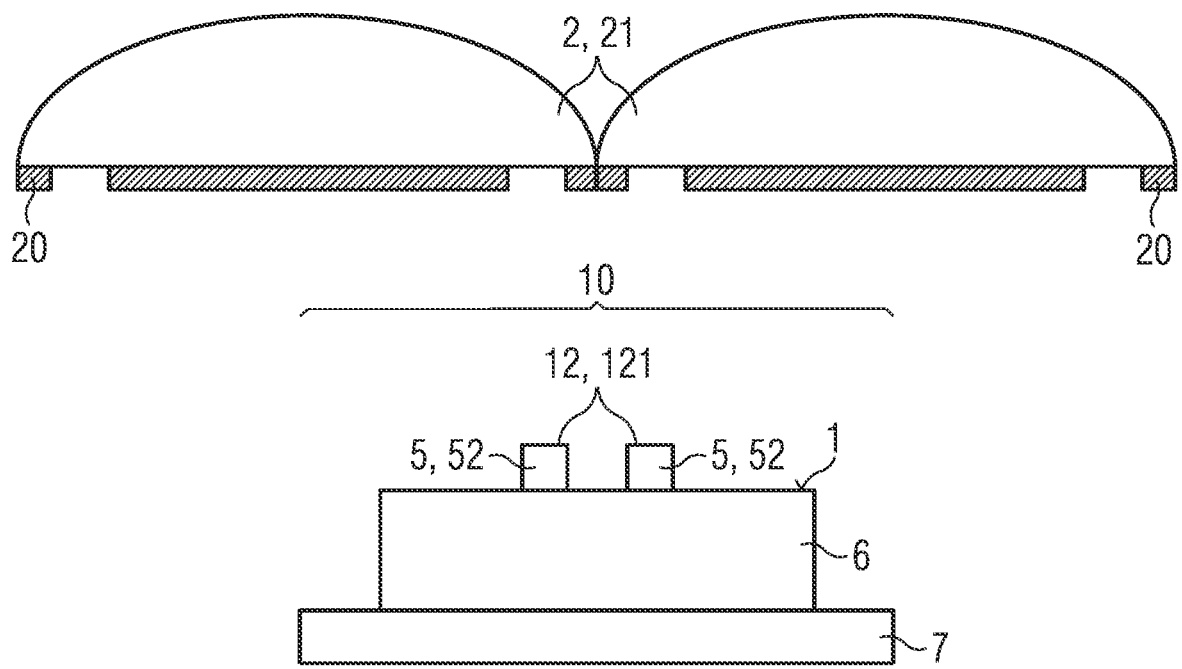

In FIGS. 3C and 3D, cross-sectional views are shown when cutting along the lines AA' and BB' from FIG. 3B.

Figure 4:
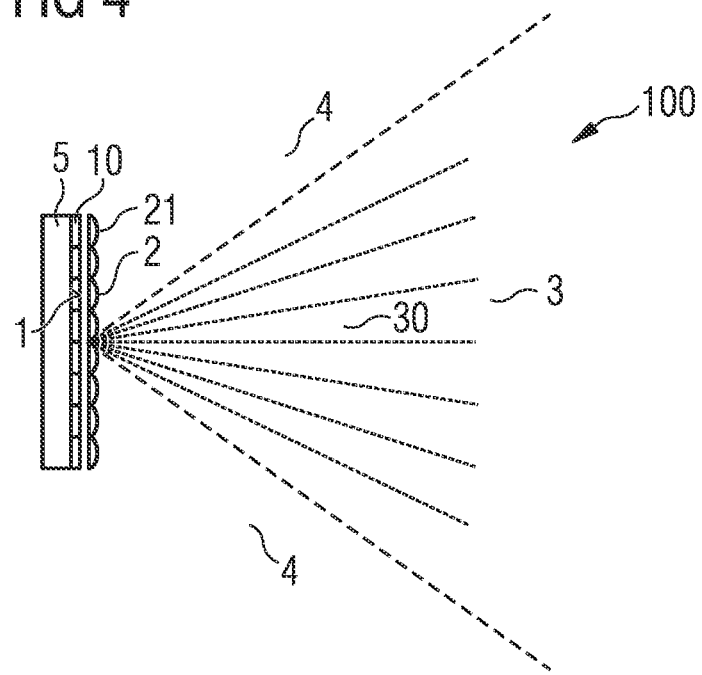
FIG. 4 is an example of the radiation-emitting device in cross-sectional view.

FIG. 4 shows an example of the radiation-emitting device 100 in cross-sectional view. During operation, the radiation-emitting device 100 emits radiation from pixels 10 of the emission surface 1. The emission surface 1 is arranged downstream of a radiation source 5 in the radiation direction. The radiation from the radiation source 5 passes through the emission surface 1. This radiation is directed via the optical element 2, comprising several lenses 21, into different spatial regions 3, 4. In particular, the optical element 2 is configured such that radiation from the first subpixels 11 is predominantly directed into a first spatial region 3 and radiation from the second subpixels 12 is predominantly directed into a second spatial region 4. The radiation mentioned here is in particular visible light.

An observer looking at the emission surface 1 in the first spatial region 3 perceives a three-dimensional image. This is realized by the fact that the optical element 2 directs light from different first subpixels 11 into different zones 30 of the first spatial region 3. In each zone 30, for example, a different perspective of an image is displayed. If the observer perceives with one eye an image from a zone 30 and with the other eye an image from an adjacent zone 30, the result is a three-dimensional image impression.

An observer looking at the emission surface 1 at any point in the second spatial region 4, on the other hand, always perceives only a two-dimensional image. For example, the image produced by the second subpixels 12 of the radiation-emitting device 100, which is directed by the optical element 2 into the second spatial region 4, is the same everywhere in the second spatial region 4.

FIG. 5 shows another example of the optical element 2 in cross-sectional view. In this example, this comprises several lenses 21, which, for example, are formed in one piece or integrally with each other. There are notches between the lenses 21, which are filled with the masking 20.

This application claims priority of DE 10 2018 107 628.2, the subject matter of which is incorporated herein by reference.

Our devices described herein are not limited by the description in conjunction with the examples. Rather, this disclosure comprises any new feature as well as any combination of features, particularly including any combination of features in the appended claims, even if the feature or combination per se is not explicitly stated in the claims or examples.

What is claimed is:

1. A radiation-emitting device comprising:
   a radiation source,
   an emission surface through which radiation from the radiation source passes during operation, wherein the emission surface comprises a plurality of pixels, each pixel comprises a plurality of subpixels, each subpixel is subdivided into at least three sub-subpixels, each of which emits light in different colors during operation,
   in plan view of the emission surface, each pixel forms a partial area of the emission surface and each subpixel forms a portion of such partial area,
   regions of a pixel not emitting any radiation during operation are colored black and configured to absorb radiation with a degree of absorption of at least 50% at least in areas,
   for each pixel, at least first subpixels are operable individually and independently of one another,
   at least some of the pixels comprise one or more second subpixels operable independently of the first subpixels,
   the sub-subpixels of the second subpixels are larger than the sub-subpixels of the first subpixels, and
   all subpixels of a pixel together make up at most 50% of the area of the pixel so that in simultaneous operation of all subpixels radiation is emitted via at most 50% of the area of the pixel.

2. The radiation-emitting device according to claim 1, further comprising an optical element arranged downstream of the emission surface in a radiation direction and configured to deflect the radiation emitted from the emission surface, wherein
   the optical element directs radiation from the first subpixels of some pixels exclusively into a first spatial region, and
   the radiation-emitting device is configured such that, in operation, it produces an image with a three-dimensional optical impression for an observer in the first spatial region who looks at the emission surface.

3. The radiation-emitting device according to claim 2, configured such that, during operation, it displays different perspectives of an image in different zones of the first spatial region, wherein a three-dimensional image impression is produced by the simultaneous perception of two perspectives for an observer.

4. The radiation-emitting device according to claim 2, wherein
   the optical element directs radiation from the second subpixels of some pixels exclusively into a second spatial region,
   the first and the second spatial regions do not overlap with each other at distances from the emission surface larger or equal than a minimum distance, and
   the radiation-emitting device is configured such that it produces an image with a two-dimensional optical impression for an observer in the second spatial region who looks at the emission surface.

5. The radiation-emitting device according to claim 4, wherein
   viewed in plan view of the emission surface, a pixel forms a parallelogram-shaped partial area of the emission surface, and
   the parallelogram-shaped partial area formed by a pixel can be divided into at least two disjoint, parallelogram-shaped portions such that all first subpixels are arranged in a first parallelogram-shaped portion and all second subpixels are arranged in one or more further parallelogram-shaped portions, each parallelogram-shaped portion comprising an edge as long as an edge of the parallelogram-shaped partial area formed by the pixel.

6. The radiation-emitting device according to claim 5, wherein an area coverage density with first subpixels in the first parallelogram-shaped portion is greater than an area coverage density with second subpixels in the further parallelogram-shaped portion.

7. The radiation-emitting device according to claim 4, wherein
a pixel is assigned several lenses, and
a lens assigned to the pixel overlaps only with the first subpixels of the pixel in plan view of the emission surface and one or more further lenses assigned to the pixel overlap only with the second subpixels of the pixel in plan view.

8. The radiation-emitting device according to claim 4, wherein the first subpixels and the second subpixels of a pixel are assigned different optoelectronic semiconductor chips.

9. The radiation-emitting device according to claim 4, wherein, in operation, the second subpixels of the pixel are controlled by an electronic component other than the first integrated circuit.

10. The radiation-emitting device according to claim 2, wherein
the optical element has a radiation-absorbing masking on a side facing the emission surface, and
viewed in plan view of the emission surface, the masking at least partially covers the regions of a pixel which do not emit radiation during operation.

11. The radiation-emitting device according to claim 1, wherein
the optical element comprises a plurality of lenses, and
a pixel is assigned at least one lens, and said lens is configured to deflect the radiation emerging from the pixel.

12. The radiation-emitting device according to claim 1, wherein
the radiation source comprises a plurality of optoelectronic semiconductor chips, and
some pixels are assigned different optoelectronic semiconductor chips.

13. The radiation-emitting device according to claim 1, wherein a pixel is uniquely assigned a first integrated circuit, the first integrated circuit being configured to individually and independently electrically drive the first subpixels of the pixel.

14. The radiation-emitting device according to claim 13, wherein, in operation, the second subpixels of the pixel are controlled by an electronic component other than the first integrated circuit.

15. The radiation-emitting device according to claim 1, wherein some subpixels are configured to emit light in the blue and/or green and/or red spectral range.

16. The radiation-emitting device according to claim 1, wherein the radiation-emitting device is an auto stereoscopic display.

17. A radiation-emitting device comprising:
a radiation source,
an emission surface through which radiation from the radiation source passes during operation,
an optical element arranged downstream of the emission surface in a radiation direction and configured to deflect the radiation emitted from the emission surface, wherein
the emission surface comprises a plurality of pixels,
each pixel comprises a plurality of subpixels,
in plan view of the emission surface, each pixel forms a partial area of the emission surface and each subpixel forms a portion of such partial area,
for each pixel, at least first subpixels are operable individually and independently of one another,
at least some of the pixels comprise one or more second subpixels operable independently of the first subpixels,
all subpixels of a pixel together make up at most 50% of the area of the pixel, so that in simultaneous operation of all subpixels radiation is emitted via at most 50% of the area of the pixel,
the optical element directs radiation from the first subpixels of some pixels exclusively into a first spatial region,
the optical element directs radiation from the second subpixels of some pixels exclusively into a second spatial region,
the first and the second spatial regions do not overlap with each other at distances from the emission surface larger or equal than a minimum distance,
the radiation-emitting device is configured such that, in operation, it produces an image with a three-dimensional optical impression for an observer in the first spatial region who looks at the emission surface, and
the radiation-emitting device is configured such that it produces an image with a two-dimensional optical impression for said observer in the second spatial region who looks at the emission surface.

* * * * *